United States Patent [19]

Moon et al.

[11] Patent Number: 5,376,576

[45] Date of Patent: Dec. 27, 1994

[54] METHOD FOR THE INSULATION OF POLYSILICON FILM IN SEMICONDUCTOR DEVICE

[75] Inventors: Chang S. Moon; Dae I. Park; Sang H. Park, all of Kyoungkido, Rep. of Korea

[73] Assignee: Hyundai Electronics Industries Co., Ltd., Ichonkun, Rep. of Korea

[21] Appl. No.: 153,654

[22] Filed: Nov. 16, 1993

[30] Foreign Application Priority Data

Nov. 19, 1992 [KR] Rep. of Korea ............... 1992-21816

[51] Int. Cl.⁵ .................... H01L 21/70; H01L 27/00
[52] U.S. Cl. ........................ 437/52; 437/67; 437/203; 437/931; 437/919; 437/24; 437/28
[58] Field of Search ............ 437/52, 203, 28, 931, 437/24, 67, 919

[56] References Cited

U.S. PATENT DOCUMENTS

| | | | |
|---|---|---|---|
| 4,939,104 | 7/1990 | Pollack et al. | 437/52 |
| 5,064,777 | 11/1991 | Dhong et al. | 437/203 |
| 5,066,607 | 11/1991 | Banerjee | 437/919 |
| 5,075,248 | 12/1991 | Yoon et al. | 437/52 |
| 5,156,993 | 10/1992 | Su | 437/203 |
| 5,198,383 | 3/1993 | Teng et al. | 437/52 |
| 5,225,363 | 6/1993 | Riemenschneider et al. | 437/52 |

FOREIGN PATENT DOCUMENTS

| | | | |
|---|---|---|---|
| 0333426 | 9/1989 | European Pat. Off. | 437/52 |
| 0227050 | 9/1988 | Japan | 437/52 |
| 0206157 | 8/1990 | Japan | 437/52 |

*Primary Examiner*—Tom Thomas
*Assistant Examiner*—Trung Dang
*Attorney, Agent, or Firm*—Darby & Darby

[57] ABSTRACT

A method for insulating a polysilicon film in a semiconductor device is disclosed.

The method comprises the steps of: forming a trench in a semiconductor covered with a first oxide film, a buffing polysilicon film and a nitride film in due order, with a mask pattern for forming the trench; coating the trench with an insulating film and filling the resulting trench with a polysilicon film for forming charge storage electrode; oxidizing the surface of the polysilicon to form a second oxide film on the polysilicon film; and implanting silicon atoms in the polysilicon film through the second oxide film to make a predetermined, upper portion of the polysilicon film be amorphous.

The thickness difference of the oxide film formed on the polysilicon film of the trench is minimized by use of the buffing polysilicon film according to the present invention. In addition, ion implantation of silicon atom make a predetermined, upper portion of the polysilicon film of the trench be amorphous, resulting in the improvement of insulating characteristics of charge storage electrode formed in the trench. Consequently, the reliability for trench capacitor of semiconductor device is much enhanced, in accordance with the present invention.

5 Claims, 5 Drawing Sheets

METHOD FOR THE INSULATION OF POLYSILICON FILM IN SEMICONDUCTOR DEVICE

BACKGROUND OF THE INVENTION

1. Field of the invention

The present invention relates, in general, to an insulation technology for polysilicon film used as a charge storage electrode of trench capacitor in a semiconductor device, more particularly to improvements in device reliability along with the technology.

2. Description of the Prior Art

Hereinafter, description will be given for a conventional method for insulating a polysilicon film serving as a charge storage electrode of trench capacitor from an upper layer thereof with reference to FIGS. 1A through 1B, wherein well known processing steps have not shown such as the formation of active regions and field stop ion-implantation region, etc. needed for the formation of trench capacitor of DRAM, for convenience.

Firstly, over a semiconductor substrate 1 covered with an oxide film 2 is formed a field oxide film 3 by local oxidation of silicon (hereinafter, "LOCOS") process and then, a nitride film 4 is formed over the resulting structure including a bird's beak formed by the LOCOS, as shown in FIG. 1A.

Next, an etch process is applied to the nitride film 4, the oxide film 3, the field oxide film 2 and the semiconductor substrate 1 so as to form a trench at a predetermined portion including the bird's beak, and a thin oxide film 5 is formed on the surface of the semiconductor 1 exposed during the formation of the trench, followed by the filling of the trench with polysilicon film 6, as shown in FIG. 1B.

Subsequently, the surface of the polysilicon film 6 is oxidized to form an oxide film 7 which is utilized as a dielectric film, the remaining nitride film serving as a mask, as shown in FIG. 1C.

Finally, the nitride film is removed and then gate electrodes are formed on predetermined portions of the resulting structure, as shown in FIG. 1D.

By the portrayed conventional method, which comprise forming a trench at a predetermined portion including a bird's beak caused during the performance of LOCOS for the formation of field oxide film, burying a polysilicon film in the trench, and forming an oxide film on the upper portion of the polysilicon film to insulate a charge storage electrode, the insulation for the polysilicon film as a charge storage electrode cannot be secured satisfactorily. For example, there is generated a phenomenon such that the peripheral thickness of the oxide film formed on the polysilicon film filling the trench at peripheral portions may be thinner than its central thickness due to the existence of the nitride film around the trench, resulting in affecting adversely the insulation of the device (referring to "A" portions in FIG. 1C).

This failure of insulation for the polysilicon film used as a charge storage electrode in a semiconductor device results in the degradation of device reliability.

SUMMARY OF THE INVENTION

Therefore, an object of the present invention is to solve the aforementioned problems encountered in the prior arts and to provide a method for insulating a polysilicon film in a semiconductor device, capable of minimizing the thickness difference between the central portion and the peripheral portions of the oxide film formed on the polysilicon film filling the trench and thus, securing the insulation of charge storage electrode, whereby the memory device can be improved in electric characteristics.

In accordance with the present invention, the object is can be accomplished by providing a method for insulating a polysilicon film in a semiconductor device, which comprises the steps of: forming a trench in a semiconductor covered with a first oxide film, a buffing polysilicon film and a nitride film in due order, with a mask pattern for forming the trench; coating the trench with an insulating film and filling the resulting trench with a polysilicon film for forming charge storage electrode; oxidizing the surface of the polysilicon to form a second oxide film on the polysilicon film; and implanting silicon atoms in the polysilicon film through the second oxide film to make a predetermined, upper portion of the polysilicon film be amorphous.

The above and other objects and advantages of the present invention will become more apparent as the following description proceeds.

To the accomplishment of the foregoing and related ends, the invention, then, comprises the features hereinafter fully described in the specification and particularly pointed out in claims, the following description and the annexed drawing setting forth in detail a certain illustrative embodiment of the invention, this being indicative, however, of but one of the various ways in which the principles of the invention may be employed.

DETAILED DESCRIPTION OF THE PREFERRED EMBODIMENT

Figure 1A:
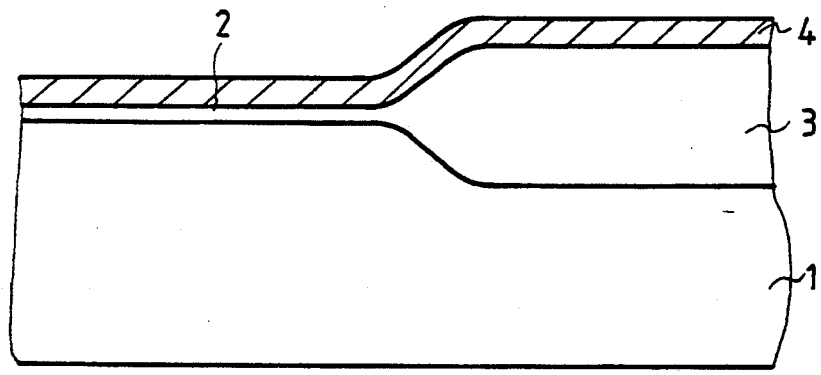
FIGS. 1A through 1D are schematic, cross sectional views illustrating conventional processing steps.
Figure 1B:
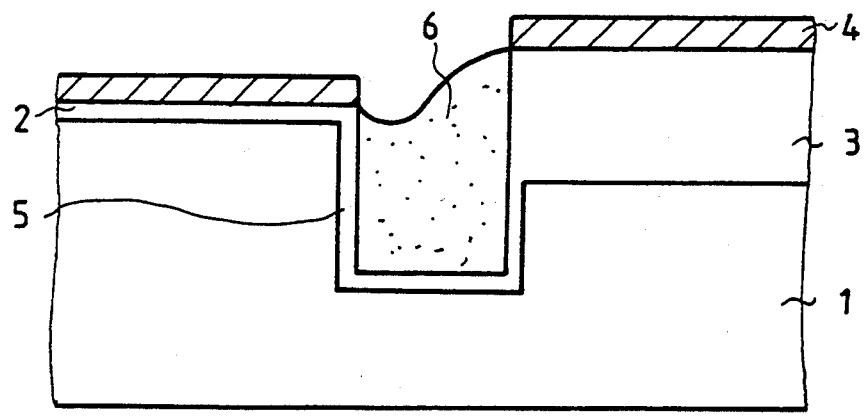
Figure 1C:
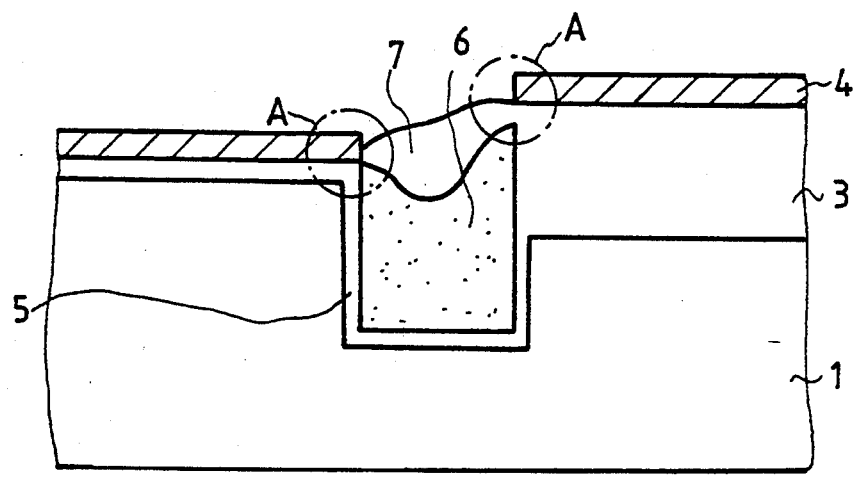
Figure 1D:
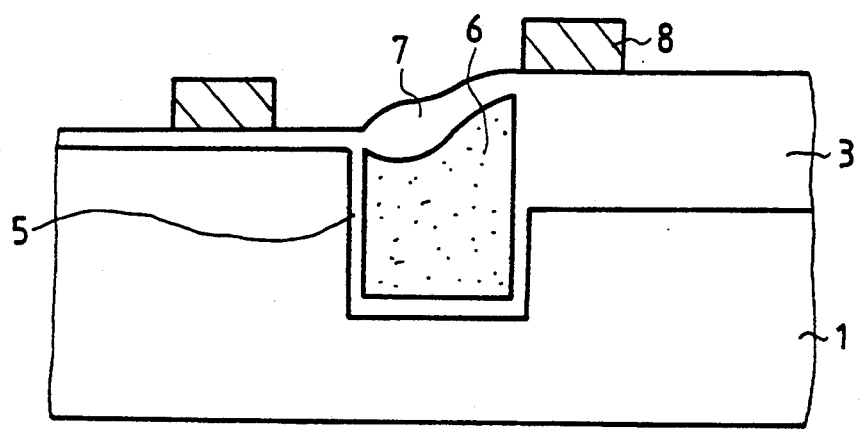

Hereinafter, preferred embodiment of the invention will be described in detail with reference to the accompanying drawings, wherein like reference numerals designate like parts. In the following description of the currently preferred method, numerous specific details are set forth such as specific layer thickness, etc. It will be obvious to those skilled in the art, that the invented method may be practiced without these specific details. In other instances, well known processing steps have not described such as the formation of active regions and field stop ion-implantation region, etc., in order not to obscure the present invention in unnecessary detail.

Referring to FIGS. 2A through 2E, there is stepwise illustrated the invented method for the insulation of polysilicon film of semiconductor device.

Figure 2A:
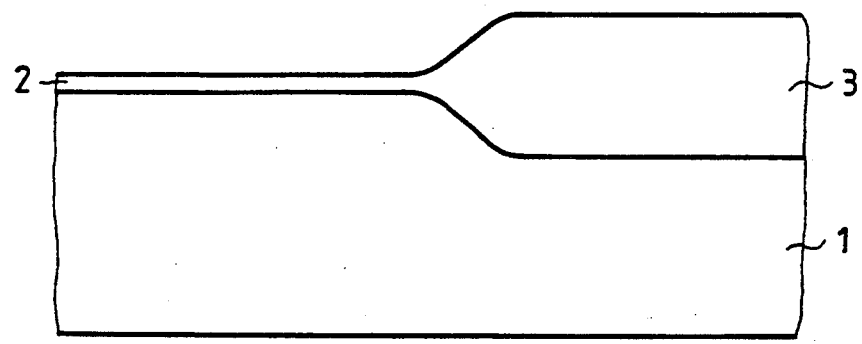
FIGS. 2A through 2E are schematic, cross sectional views illustrating processing steps according to the present invention.

Firstly, over a semiconductor substrate 1 is formed an oxide film 2 and then, a field oxide film 3 is formed over the resulting structure, resulting in the formation of bird's beak, as shown in FIG. 2A.

Figure 2B:
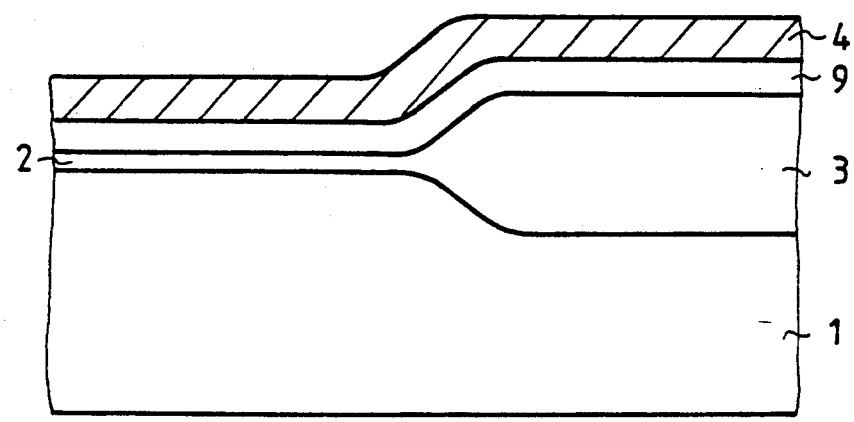

Subsequently, over the oxide film 2 and the field oxide film 3, a buffing polysilicon film 9 with a thickness of approximately 200 to 800 Å and a nitride film 4 with a thickness of approximately 1,000 to 2,000 Å are formed, in due order, as shown in FIG. 2B.

Figure 2C:
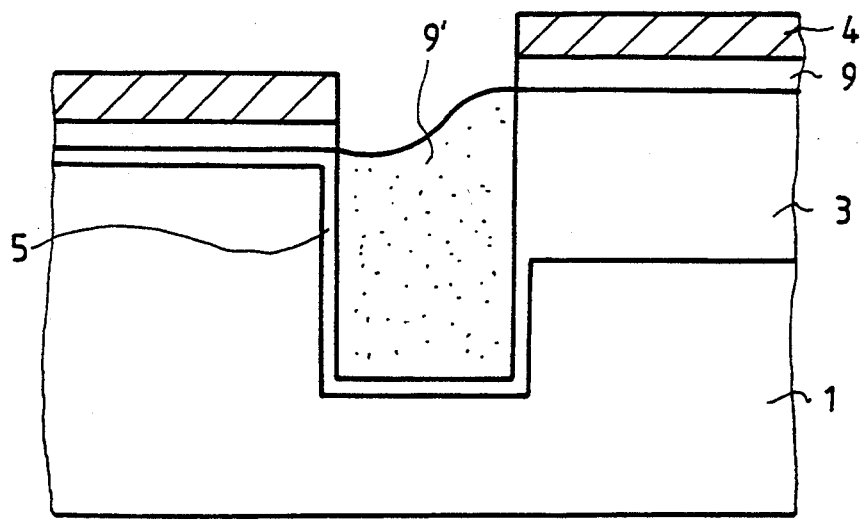

Next, an etch process is applied to the nitride, the buffing polysilicon film 9, the oxide film 2 and the semiconductor substrate 1 to form a proper size trench at a predetermined including the bird's beak, and then, the exposed surface of the trench is coated with an oxide film with a thickness of approximately 100 to 500 Å, followed by the filling of the trench with a polysilicon film 9', as shown in FIG. 2C. At this time, the polysilicon film 9' is allowed to have n+ type conductivity and is used as a charge storage electrode.

Figure 2D:
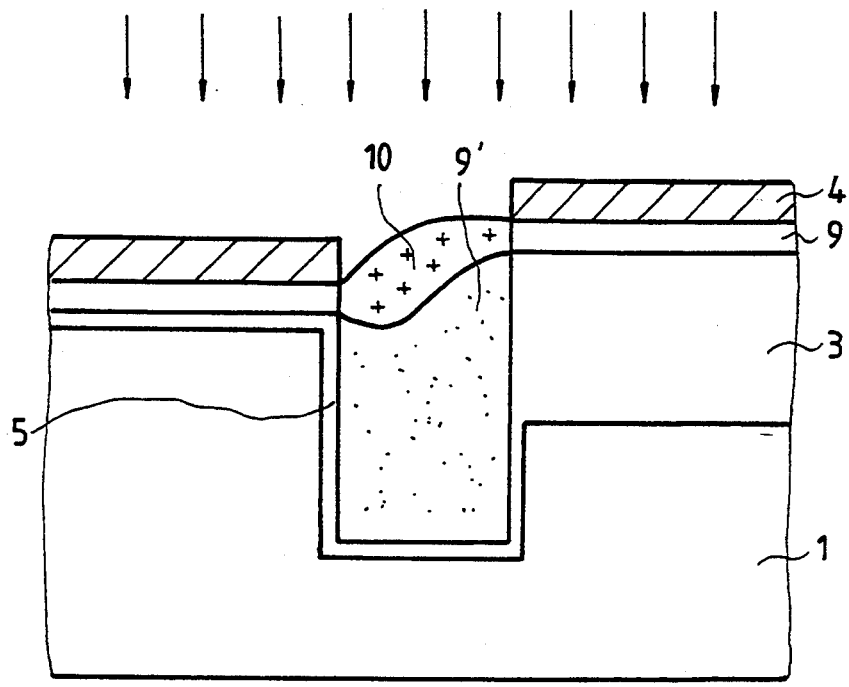
Figure 2E:
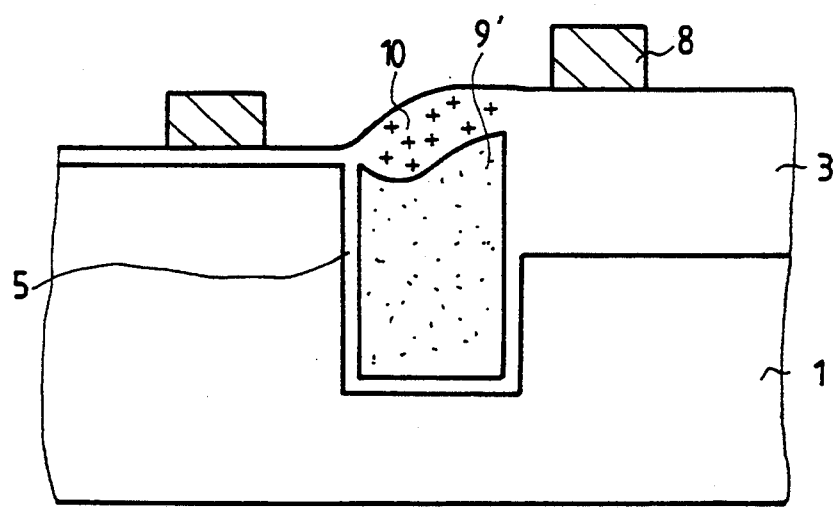

FIG. 2D shows an oxide film 10 with an almost uniform thickness formed on the polysilicon 9'. For the formation of the oxide film 10, the surface of the polysilicon film 9' is initially oxidized to form an oxide film, using the remaining nitride film as a mask. The resulting oxide film has variable thickness, for example, peripheral portion thinner than the central portion and does not guarantee the insulation effect, like the conventional film. Silicon atoms (Si) is implanted at a dose of approximately $10^{14}$ to $10^{19}$ atoms/cm$^2$ under an acceleration energy of approximately 10 to 50 KeV to make the upper portion of the polysilicon film 9' amorphous, bringing out securing the insulation effect. The formation of the buffing polysilicon film 9 described in FIG. 2B allows the oxide film with thin peripheral portions to become thicker. As a result, the thickness of the insulating film 10 formed from the surface oxidation of the polysilicon 9' is approximately 3,000 to 8,000 Å thick.

Finally, the nitride film 4 and the polysilicon film 9 are subjected to an etch process so as to be removed, in due order, and then, gate electrodes 8 are formed over the resulting structure.

Since the thin oxide film 5 in the trench is used as a dielectric film when forming a trench capacitor of DRAM, the dielectric film may be a double film consisting of oxide film covered with another nitride film or a triple film of, for example, oxide film/nitride film/oxide film.

As explained hereinbefore, the thickness difference of the oxide film formed on the polysilicon film of the trench is minimized by use of the buffing polysilicon film according to the present invention. In addition, ion implantation of silicon atom make a predetermined, upper portion of the polysilicon film of the trench be amorphous, resulting in the improvement of insulating characteristics of charge storage electrode formed in the trench. Consequently, the reliability for trench capacitor of semiconductor device is much enhanced, in accordance with the present invention.

What is claimed is:

1. A method for insulating a polysilicon film of semiconductor device, comprising the steps of:

forming a trench in a semiconductor covered with a first oxide film, a buffing polysilicon film and a nitride film in due order, with a mask pattern for forming the trench;

coating the trench with an insulating film and filling the resulting trench with a polysilicon film for forming charge storage electrode;

oxidizing the surface of the polysilicon to form a second oxide film on the polysilicon film; and implanting silicon atoms in the polysilicon film through the second oxide film to make a predetermined, upper portion of the polysilicon film be amorphous.

2. A method according to claim 1, wherein said second oxide film has a thickness of approximately 3,000 to 6,000 Å.

3. A method according to claim 1, wherein said silicon atoms is implanted at a dose of approximately $10^{14}$ to $10^{19}$ atoms/cm$^2$ under an acceleration energy of approximately 10 to 50 KeV.

4. A method according to claim 1, wherein said insulating film coated on the surface of said trench is an oxide film.

5. A method according to claim 1, wherein said insulating film coated on the surface of said trench is a double film consisting of an oxide film and a nitride film.

* * * * *